United States Patent [19]

Niedra

[11] Patent Number: 5,057,719
[45] Date of Patent: Oct. 15, 1991

[54] PASSIVELY FORCED CURRENT SHARING AMONG TRANSISTORS

[75] Inventor: Janis M. Niedra, North Ridgeville, Ohio

[73] Assignee: Sverdrup Technology, Inc., Tullahoma, Tenn.

[21] Appl. No.: 545,387

[22] Filed: Jun. 27, 1990

[51] Int. Cl.$^5$ ............ H03K 17/60; H03K 17/56; H02J 1/04; H03F 3/26
[52] U.S. Cl. ............... 307/570; 307/270; 307/242; 307/254; 307/60; 330/275; 330/277
[58] Field of Search ............ 307/571, 270, 443, 254, 307/296.5, 1, 355, 570, 242, 60; 323/312, 315; 330/275, 277, 261

[56] References Cited

U.S. PATENT DOCUMENTS

| | | | |
|---|---|---|---|
| 4,618,779 | 10/1986 | Wiscombe | 307/60 |
| 4,634,892 | 1/1987 | Isbell et al. | 307/355 |
| 4,675,561 | 6/1987 | Bowers | 307/296.7 |
| 4,779,060 | 10/1988 | Henden | 330/277 |
| 4,929,907 | 5/1990 | Berkel | 330/261 |

OTHER PUBLICATIONS

Delaney, "Electronics for the Physicist", 1969, pp. 1-47.
James Forsythe Techniques for Controlling Dynamic Current Balance in Parallel Power MOSFET Configurations, Proceedings of Powercon 8 G-3, pp. 1-11, Power Concepts, Inc., 1981.
Technical Info Center Power MOSFET Transistor Data, Motorola, Inc., 1988, pp. 2-7-2 through 2-7-23 and Misc.

Primary Examiner—Stanley D. Miller
Assistant Examiner—Trong Phan
Attorney, Agent, or Firm—Watts, Hoffmann, Fisher & Heinke Co.

[57] ABSTRACT

This application concerns a simple passive circuit that improves current balance in paralleled power MOSFETs that are not precisely matched and that are operated in their active region from a common gate drive. A nonlinear circuit consisting of diodes and resistors generates a differential gate potential required to correct for unbalance while maintaining low losses over a range of current.

8 Claims, 1 Drawing Sheet

PASSIVELY FORCED CURRENT SHARING AMONG TRANSISTORS

The invention described herein was made in the performance of work under NASA Contract No. NAS3-25266, and is subject to the provisions of Section 305 of the National Aeronautics and Space Act of 1958, as amended (42 U.S.C. §2457).

FIELD OF THE INVENTION

The present invention concerns circuitry for sharing a current load among a plurality of transistors to equalize the current among those transistors.

BACKGROUND ART

In high power linear applications that use power transistors, it is often a requirement that the current be shared among two or more parallel configured transistors to stay within the power dissipation ratings of those transistors. In such applications, the benefit achieved by parallel current sharing is reduced if one of the transistors operates in such a manner that it carries most of the current load. Difficulties have been experienced in current sharing applications due to the operating characteristics of the transistors.

In a linear mode, the operating point of a transistor typically swings from a high drain-to-source voltage ($V_{DS}$) at low drain or load current ($I_D$) to a point of low $V_{DS}$ at high $I_D$. The thermal load may be substantial at even low currents, however, and to take full advantage of the field effect transistors inherent immunity to secondary breakdown there is a need to assure good current sharing from the maximum current down to a small fraction of the maximum. Thus, it is not satisfactory to only assure current sharing at high currents.

It is known that the current sharing across a wide range of currents can be difficult to achieve due to the temperature driven instability of the field effect transistor. The Motorola reference document entitled "Power MOSFET Transistor Data" (Third Edition, Second Printing, Motorola, Inc. 1988) recognizes good current sharing is difficult to achieve across a broad range of currents. The disclosure of this reference document is incorporated herein by reference. At low load currents where the gate-to-source control voltage falls below about 6 volts, an increase in the junction temperature increases the load current. This is a consequence of the decrease in the threshold voltage between the gate and source overcoming the effect of an increase in the drain-to-source DC resistance of the ON state transistor.

Inexpensive remedies to the problem of current sharing over a wide range of load currents have been difficult to achieve. In a typical application a self-biasing resistor is connected between the transistor source and ground. If a small value resistor is used for this self-biasing function, it functions well at high load currents. At low currents, however, the small value resistor becomes ineffective. If a large biasing resistor is chosen, it works well at low currents but cannot work at high currents needed in high power transistor applications.

Two prior art documents concerning the sharing of load current in parallel configured field effect transistors are a paper entitled "Techniques for Controlling Dynamic Current Balance and Parallel Power MOSFET Configurations" by Forsythe, Proceedings of Power Con 8, 1981 and U.S. Pat. No. 4,779,060 to Henden, issued Oct. 18, 1988. The '060 patent to Henden recognizes the difficulty in attempting to achieve current balance over a wide range of operating conditions. The technique disclosed in this patent for addressing this problem is to operate a parallel configured MOSFET circuit and dynamically trim gate-to-source resistances under actual load conditions to achieve current sharing amongst multiple transistors.

DISCLOSURE OF THE INVENTION

The present invention concerns a straight forward and simple circuit that reduces unbalance among parallel configured transistors at both high and low currents. The circuit uses non-linear elements for self biasing the transistors and in effect produces a variable resistance as current conditions change. The circuit is most effective in reducing mismatches in load current at static or low switching speeds.

A circuit constructed in accordance with the invention includes a number of transistors that can be coupled to a load for sharing current within the load. Each transistor includes a control electrode for adjusting the conductive state of the transistor and two additional electrodes for carrying a load current. A control circuit applies a common control signal to the control electrode of each of the transistors. A biasing circuit coupled to the transistors applies a differential biasing voltage to each of the plurality of transistors to achieve a more equal load current sharing among the transistors. The biasing circuit includes a diode and resistor series coupled between one of the additional electrodes of each transistor and a ground or reference voltage connection. A variable resistance element is coupled to the additional electrode of each transistor to provide an alternate current path to the ground or reference connection.

This circuit arrangement provides variable operation at high and low currents. At high currents the diode constitutes a small fraction of the voltage difference between the ground or reference potential and the transistor electrode. Most of the voltage drop therefore occurs across the series connected resistor. As the load current decreases, the voltage across the diode remains relatively unchanged and becomes significant compared to the voltage drop across the series connected resistor. When this occurs, current is shunted away from the diode/resistor combination to the adjustable resistance to provide a different bias voltage needed to maintain current balance.

A preferred embodiment of the invention is for use with field effect transistors and the preferred variable resistance is a center tapped variable resistor coupled between the source electrode of two adjacent transistors. When more than two transistors are utilized in the circuit multiple center tap resistances are utilized.

The circuit is operated at both high and low currents and the current sharing performance of the circuit monitored. The setting of the center tap resistance is adjusted so that a more equal current sharing at low currents is provided.

Other objects, advantages and features of the invention will become better understood when a detailed description of a preferred embodiment of the invention is described in conjunction with the accompanying drawings.

BEST MODE FOR CARRYING OUT THE INVENTION

Figure 1:
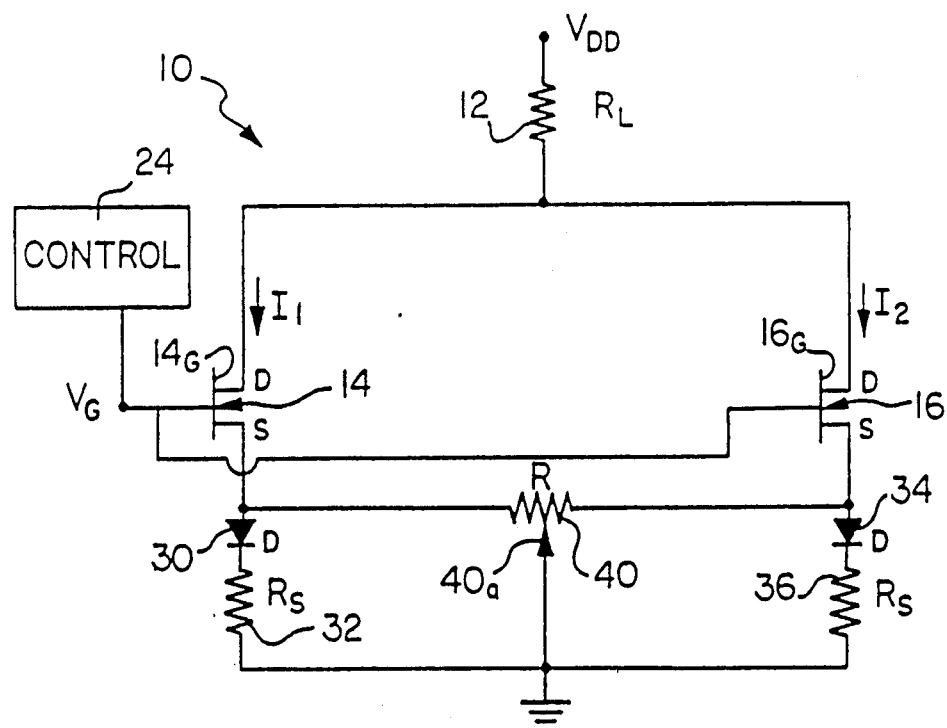
FIG. 1 is a schematic showing two field effect transistors connected in parallel to share load current and having gate or control electrodes coupled together and FIG. 2 is a graph showing current deviations as a percentage of total current between two parallel connected field effect transistors showing that current sharing remains relatively equal across a range of load current values.

Turning now to the drawings, FIG. 1 is a detailed schematic showing a circuit 10 constructed in accordance with the present invention. Current passes through a load 12 due to application of an externally applied voltage $V_{DD}$. The current is divided between two field effect transistors 14, 16 having gate electrodes 14G, 16G coupled together. A source 24 of a control voltage $V_G$ applies the same control voltages to each of the field effect transistors so that as the current is adjusted up and down through one transistor it also varies in a similar fashion through the second, parallel transistor.

A biasing circuit maintains a voltage difference between the gate and source electrode of each of the transistors. The first transistor 14, for example, includes a series connected diode 30 and resistor 32. The source electrode of the second field effect transistor 16 is coupled to a second combination of a diode 34 and resistor 36. Connected between the source electrodes of the two field effect transistors 14, 16 is a center tapped variable resistor 40. The center tap 40a of this resistor 40 can be manually adjusted during operation of the circuit. By shifting the center tap position from side to side and operating the circuit at both high and low currents, it is possible to optimize the current sharing characteristics of the circuit 10.

Representative values for the resistors 32, 36 are 0.5 ohms The total resistance of the center tap resistor 40 is 2 ohms. At high currents, most current passes through the diodes 30, 34 and small resistance biasing resistors 32, 36. As $I_D$ current drops, however, the relatively constant voltage drop across the diode becomes significant compared to the voltage across one side of the center tap variable resistor 40. Thus, as the diode currents drop to where the series resistors become ineffective, the resistor 40 begins providing the differential voltage drop across the gate/source junctions to maintain current equalization. Stated another way, as the "effective resistance" of the diode increases at low currents, current is shunted to the center tap resistor 40 to maintain the differential voltage drop.

Figure 2:
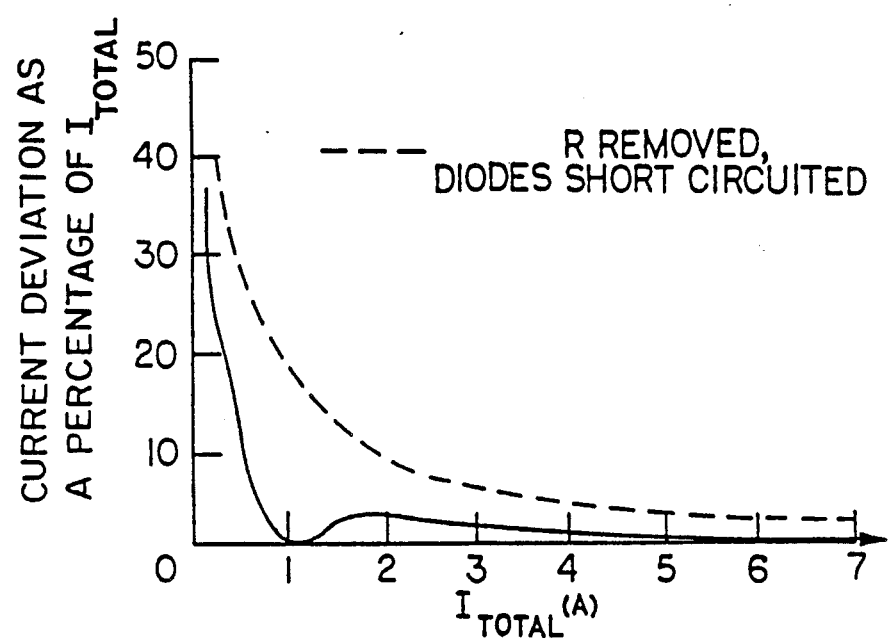

To compare performance of the circuit depicted in FIG. 1 with a conventionally biased parallel current sharing transistor circuit, the two diodes depicted in FIG. 1 are short circuited and the center tap resistor 40 removed from the circuit. This results in a conventional parallel configured FET circuit. As seen in FIG. 2, the current deviation as a percentage of total current for this arrangement is significantly larger than the solid line depiction for a circuit constructed in accordance with FIG. 1.

The FIG. 1 circuit was constructed using type MTM15N40 power MOSFETs (N-channel, enhancement mode, 15A, 400V, 250W) and type 1N1201 silicon diodes. $V_{DD}$ was a constant voltage power supply. The resistors 32, 36 are 0.5 Ω and the total resistance of the resistor 40 is 2 Ω. To demonstrate the current sharing, the total current $I_1+I_2$ was controlled to be a triangular wave, rising from and returning to a small value. The slope of current change was approximately 0.03 A/$\mu$-sec.

FIG. 2 plots x-y oscilloscope trace data (solid line) showing a relative deviation $(I_1-I_2)/(I_1+I_2)$, in percent, versus the total current $(I_1+I_2)$. This plot shows that the relative deviation remains less than 4 percent from 0.8 A to over 7 A of total current. Only at low currents, below about 0.5 A, does the current balance fail rapidly. For the particular transistors tested, the difference in gate-source voltage was 0.25 V, and the tap on the resistor 40 was adjusted to about 0.8 Ω from one end in a subjective judgment of what seemed optimum current sharing. Variation of this tap was observed to affect the local minimum in the deviation (here at $I \approx 1$ A) and to displace the $I_1$ versus $I_2$ trace.

The FIG. 1 circuit shows two MOSFET transistors connected in parallel to a load. The disclosed differential bias technique can be extended to more than two transistors. It is the intent that the invention include all modifications and alterations from the disclosed design falling within the spirit or scope of the appended claims.

I claim:
1. Circuitry comprising:
  a) a plurality of transistors coupled to a load for sharing current in the load, wherein each transistor includes a control electrode for adjusting a conductive state of the transistor and first and second additional electrodes for carrying a load current;
  b) control means for coupling a common control signal to the control electrode of each of said plurality of transistors; and
  c) biasing circuitry coupled to said plurality of transistors for applying a biasing voltage to the plurality of transistors to distribute load current among the plurality of transistors;
  d) said biasing circuitry comprising i) a series combination of a diode and a resistor coupled between one additional electrode of said first and second additional electrodes of each transistor and a reference voltage connection and ii) variable resistance means coupled between said one additional electrode of each transistor and the reference voltage connection to provide a current path to the reference voltage connection in parallel to the series combination of the diode and the resistor.

2. The circuitry of claim 1 wherein the plurality of transistors comprise field effect transistors.

3. The circuitry of claim 1 wherein the variable resistance means comprises at least one center tapped variable resistor for each two transistors and wherein the center tap is connected tot he reference voltage connection and each variable resistor is coupled between said one additional electrode of each of said two transistors.

4. The circuitry of claim 1 wherein the reference voltage connection is a ground connection.

5. Circuitry comprising:
  a) a plurality of transistors coupled to a load for sharing current in the load, wherein each transistor includes a control electrode for adjusting a conductive state of the transistor and first and second additional electrodes for carrying a load current;
  b) control means for coupling a common control signal to the control electrode of each of said plurality of transistors; and c) biasing circuitry coupled to said plurality of transistors for applying a biasing voltage tot he plurality of transistors to distribute load current among the plurality of transistors;

d) said biasing circuitry comprising i) a series combination of a variable resistance passive element and a constant resistance element coupled between one additional electrode of said first and second additional electrodes of each transistor and a reference voltage connection to provide a first current path and ii) an adjustable resistance means coupled to said one additional electrode of each of the plurality of transistors and tot he reference voltage connection to provide a second current path to the reference voltage connection as current varies in the variable resistance passive element.

6. The circuitry of claim 5 wherein the plurality of transistors comprise field effect transistors.

7. The circuitry of claim 5 wherein the adjustable resistance means comprises at least one center tapped adjustable resistor for each two transistors and wherein the center tap is connected to the reference voltage connection and each adjustable resistor is coupled between said one additional electrode of said two transistors.

8. The circuitry of claim 5 wherein the reference voltage connection is a ground connection.

* * * * *